United States Patent
Tsai et al.

(10) Patent No.: US 10,332,786 B2
(45) Date of Patent: Jun. 25, 2019

(54) METHOD FOR MANUFACTURING A SEMICONDUCTOR DEVICE

(71) Applicant: TAIWAN SEMICONDUCTOR MANUFACTURING CO., LTD., Hsinchu (TW)

(72) Inventors: Wen-Che Tsai, Hsinchu (TW); Min-Yann Hsieh, Kaohsiung (TW); Hua-Feng Chen, Hsinchu (TW); Kuo-Hua Pan, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/619,595

(22) Filed: Jun. 12, 2017

(65) Prior Publication Data

US 2018/0315646 A1 Nov. 1, 2018

Related U.S. Application Data

(60) Provisional application No. 62/491,240, filed on Apr. 27, 2017.

(51) Int. Cl.
H01L 21/768 (2006.01)
H01L 21/28 (2006.01)
H01L 21/283 (2006.01)

(52) U.S. Cl.
CPC ...... H01L 21/76816 (2013.01); H01L 21/283 (2013.01); H01L 21/28008 (2013.01); H01L 21/76877 (2013.01)

(58) Field of Classification Search
CPC ....... H01L 21/823475; H01L 21/76885; H01L 21/76877; H01L 21/76895; H01L 23/485; H01L 29/665; H01L 27/088; H01L 21/76807; H01L 23/53228; H01L 23/53257; H01L 2924/0002
See application file for complete search history.

(56) References Cited

U.S. PATENT DOCUMENTS

| | | | |
|---|---|---|---|
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2011/0143529 A1* | 6/2011 | Lee | H01L 21/28185 438/591 |

(Continued)

*Primary Examiner* — Mohammed R Alam
(74) *Attorney, Agent, or Firm* — McClure, Qualey & Rodack, LLP

(57) ABSTRACT

A method for manufacturing a semiconductor device includes forming a gate stack over a substrate; forming an interlayer dielectric over the substrate to cover the gate stack; forming an opening in the interlayer dielectric to expose to the gate stack; forming a glue layer over the interlayer dielectric and in the opening; partially removing the glue layer, in which a portion of the glue layer remain in the opening; and tuning a profile of the remained portion of the glue layer.

20 Claims, 13 Drawing Sheets

(56) References Cited

U.S. PATENT DOCUMENTS

| | | | | |
|---|---|---|---|---|
| 2012/0052641 A1* | 3/2012 | Lee | .................... | H01L 21/28088 438/270 |
| 2013/0280900 A1* | 10/2013 | Lai | .................... | H01L 21/82384 438/589 |
| 2015/0021672 A1* | 1/2015 | Chuang | ............. | H01L 21/28088 257/288 |

* cited by examiner

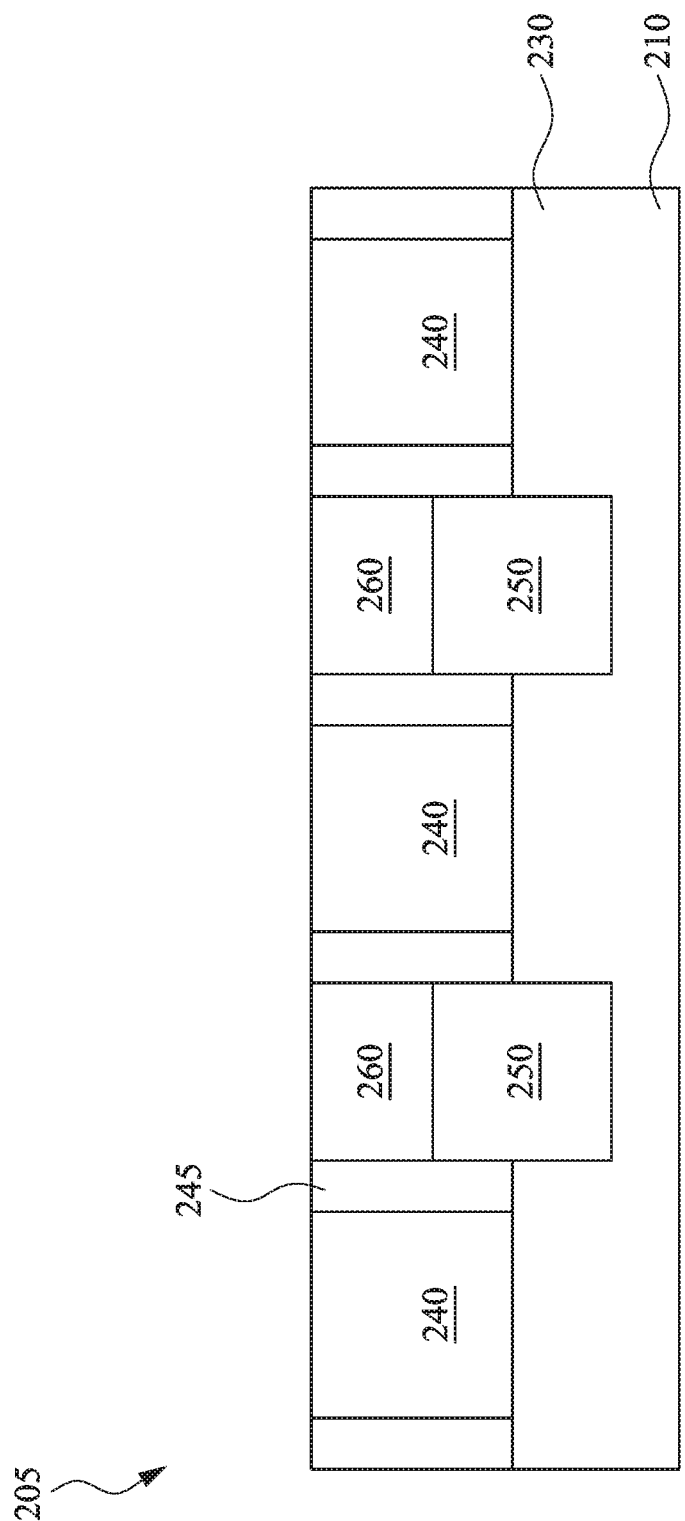

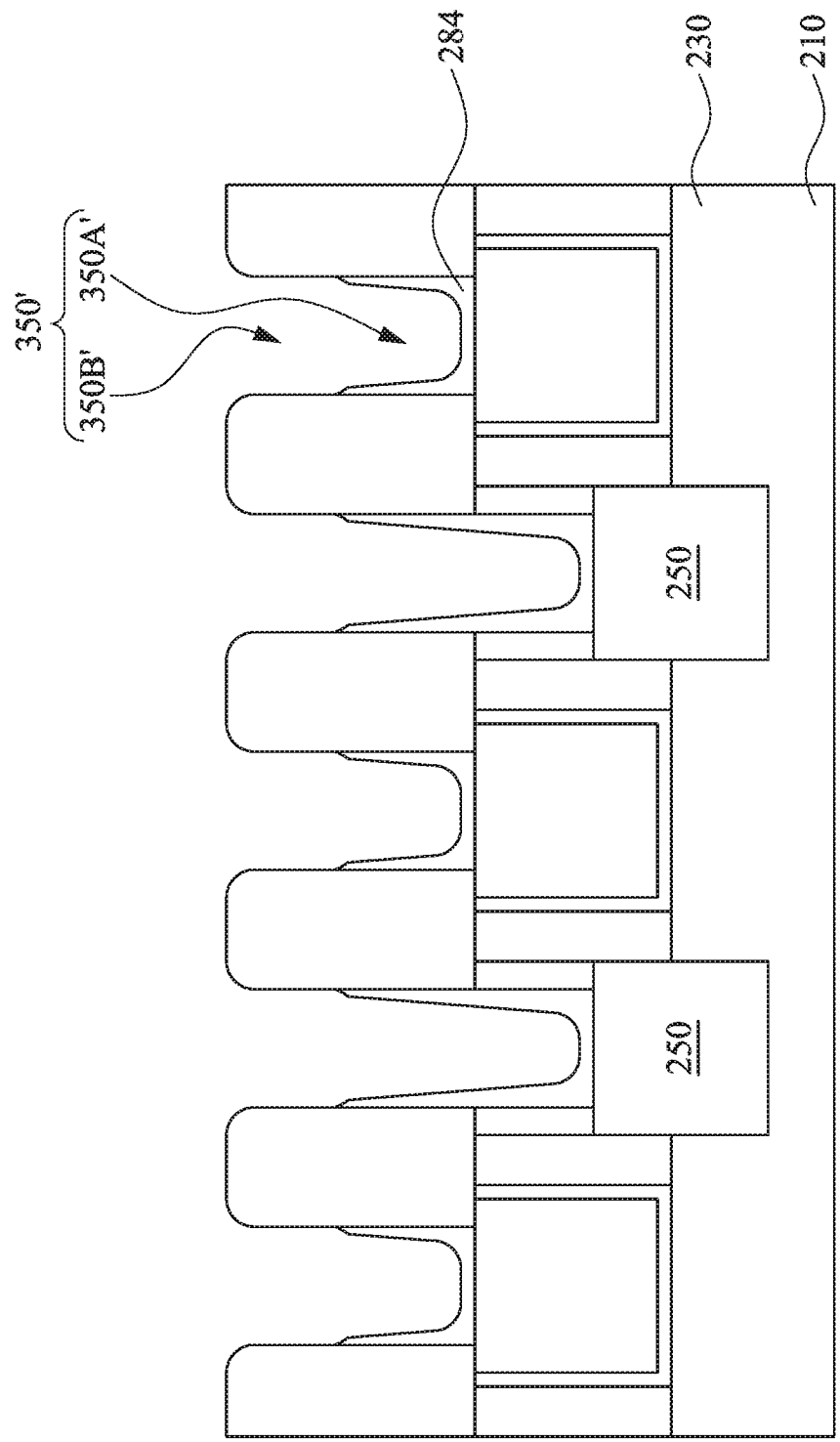

METHOD FOR MANUFACTURING A SEMICONDUCTOR DEVICE

PRIORITY CLAIM AND CROSS-REFERENCE

This application claims priority to U.S. Provisional Application Ser. No. 62/491,240, filed Apr. 27, 2017, which is herein incorporated by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

As a part of the semiconductor fabrication, conductive elements may be formed to provide electrical interconnections for the various components for an IC. For example, conductive plug for interconnecting different metal layers may be formed by etching openings in an interlayer dielectric (ILD) and filling the openings with a conductive material.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a cross-sectional view of line A-A of FIG. 1.

FIGS. 2B to 2L are cross-sectional views of line A-A of FIG. 1 in the following processes.

DETAILED DESCRIPTION

Figure 1:
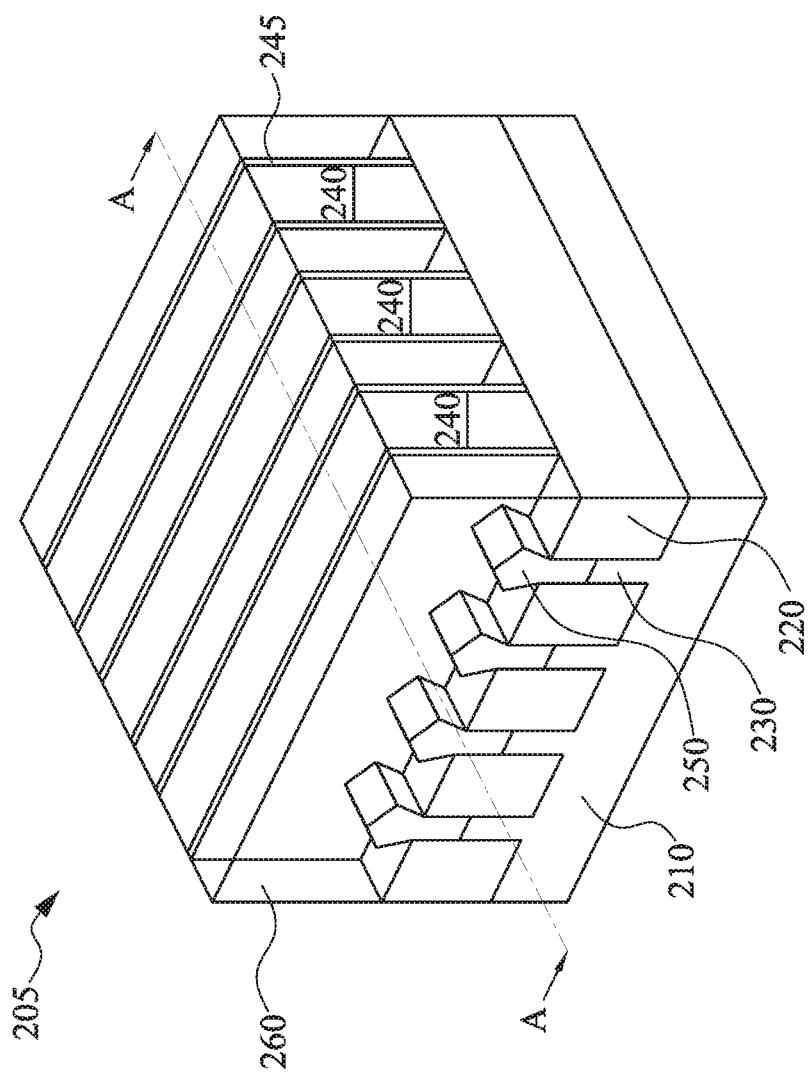
FIG. 1 is a diagrammatic perspective view of an example of a work piece of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments of the present disclosure provide some improved methods for the formation of semiconductor devices and the resulting structures. These embodiments are discussed below in the context of forming finFET transistors having a single fin or multiple fins on a bulk silicon substrate. One of ordinary skill in the art will realize that embodiments of the present disclosure may be used with other configurations.

Figure 2B:
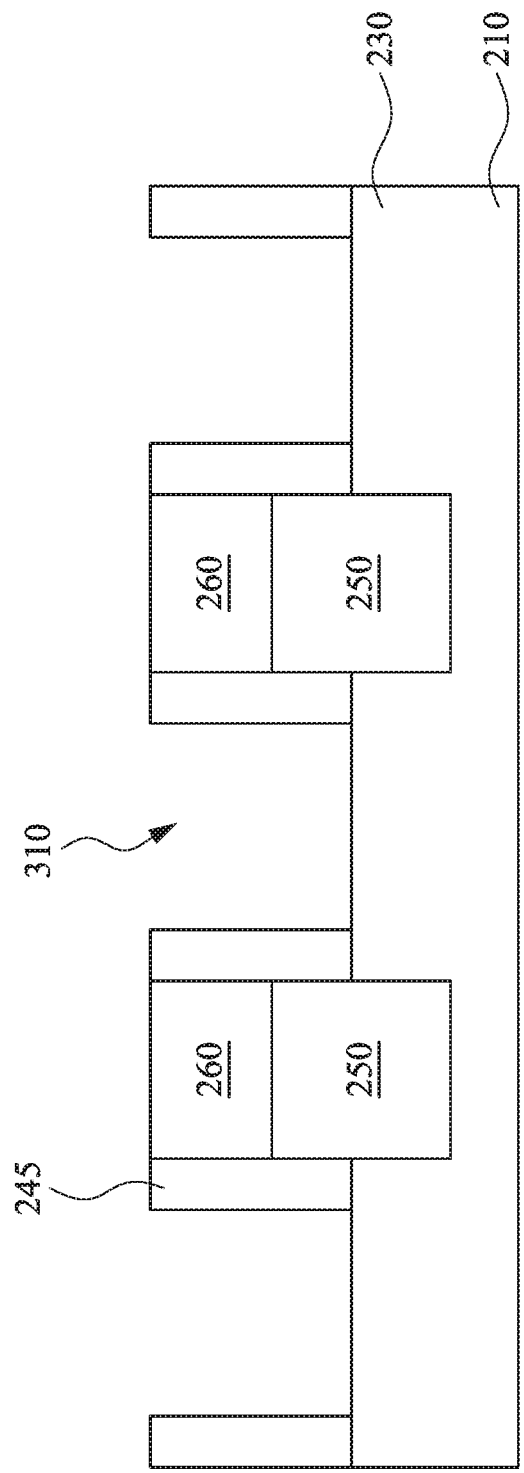

FIG. 1 is a diagrammatic perspective view of an example of a work piece of a semiconductor device in accordance with some embodiments. FIG. 2A is a cross-sectional view of line A-A of FIG. 1. FIGS. 2B to 2L are cross-sectional views of line A-A of FIG. 1 in the following processes. It is understood that additional operations can be provided before, during, and after processes shown by FIGS. 1, and 2A to 2L, and some of the operations described below can be replaced or eliminated, for additional embodiments of the method. The order of the operations/processes may be interchangeable.

Reference is made to FIGS. 1 and 2A. A workpiece 205 is received. The workpiece 205 includes a substrate 210. The substrate 210 may be a bulk silicon substrate. Alternatively, the substrate 210 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer includes suitable material(s), including silicon oxide, sapphire, and/or combinations thereof. An exemplary insulator layer may be a buried oxide layer (BOX). The insulator is formed by suitable process(es), such as implantation (e.g., SIMOX), oxidation, deposition, and/or other suitable process. In some exemplary semiconductor device, the insulator layer is a component (e.g., layer) of a silicon-on-insulator substrate.

The substrate 210 may also include various doped regions. The doped regions may be doped with p-type dopants, such as boron or $BF_2$; n-type dopants, such as phosphorus or arsenic; or combinations thereof. The doped regions may be formed directly on the substrate 210, in a P-well structure, in an N-well structure, in a dual-well structure, and/or using a raised structure. The substrate 210 may further include various active regions, such as regions configured for an N-type metal-oxide-semiconductor transistor device and regions configured for a P-type metal-oxide-semiconductor transistor device.

The substrate 210 may also include various isolation features 220. The isolation features 220 separate various device regions in the substrate 210. The isolation features 220 include different structures formed by using different processing technologies. For example, the isolation features 220 may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features 220.

The workpiece 205 also includes a plurality of semiconductor fins 230 formed over the substrate 210. The semiconductor fins 230 may include Si, SiGe, silicon germanium tin (SiGeSn), GaAs, InAs, InP, or other suitable materials. In some embodiments, the semiconductor fin 230 is formed by suitable process(es) including various deposition, photolithography, and/or etching processes. As an example, the semiconductor fin 230 is formed by patterning and etching a portion of the substrate 210.

The semiconductor fin 230 may be patterned by suitable method(s). For example, the semiconductor fin 230 may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the semiconductor fin 230.

The workpiece 205 also includes a plurality of gate stacks 240 over the substrate 210, including wrapping over portions of the semiconductor fins 230. In some embodiments, the gate stacks 240 are dummy gate stacks, which will be replaced by high-k/metal gates (HK/MG) in later processes. The dummy gate stacks 240 may include a dielectric layer and a polysilicon layer. The dummy gate stacks 240 may be formed by suitable process or processes, such as deposition, patterning and etching.

Sidewall spacers 245 are formed along the sidewalls of the dummy gate stacks 240. The sidewall spacers 245 may include a dielectric material such as silicon oxide. Alternatively, the sidewall spacers 245 may include silicon nitride, silicon carbide, silicon oxynitride, or combinations thereof. In some embodiments, the sidewall spacers 245 have multiple layers. For example, an oxide layer is formed along the sidewalls of the dummy gate stacks 240, and a nitride layer is formed on the oxide layer. The sidewall spacers 245 may be formed by depositing a gate sidewall spacer layer and then anisotropic dry etching the gate sidewall spacer layer, known in the art.

The workpiece 205 also includes epitaxy structures 250 formed over the substrate 210, the semiconductor fins 230, and beside the dummy gate stacks 240 (with the sidewall spacers 245). In some embodiments, some of the epitaxy structures 250 are source feature, and some of the epitaxy structures 250 are drain feature. The epitaxy structures 250 are separated by the dummy gate stacks 240. In some embodiments, a portion of the semiconductor fin 230, beside the dummy gate stacks 240 are recessed to form S/D recesses and then the epitaxy structures 250 are formed over the S/D recesses by epitaxial growing processes, including chemical vapor deposition (CVD) deposition techniques (e.g., vapor-phase epitaxy (VPE) and/or ultra-high vacuum CVD (UHV-CVD)), molecular beam epitaxy, and/or other suitable processes. The epitaxy structures 250 may include Ge, Si, GaAs, aluminum gallium arsenide (AlGaAs), SiGe, gallium arsenide phosphide (GaAsP), GaSb, InSb, indium gallium arsenide (InGaAs), InAs, or other suitable materials. After the S/D recesses are filled with the S/D feature 250, further epitaxial growth of a top layer of the epitaxy structures 250 expands horizontally and facets may start to form, such as a diamond shape facets. The epitaxy structures 250 may be in-situ doped during the epi processes. In some embodiments, the S/D feature 250 is not in-situ doped, an implantation process (i.e., a junction implant process) is performed to dope the epitaxy structures 250. One or more annealing processes may be performed to activate dopants. The annealing processes comprise rapid thermal annealing (RTA) and/or laser annealing processes.

The workpiece 205 also includes a first interlayer dielectric (ILD) layer 260 deposited over the substrate 210, including between/over at least one of the dummy gate stacks 240 and over the epitaxy structures 250. The first ILD layer 260 may be deposited by CVD, atomic layer deposition (ALD), spin-on coating, or other suitable techniques. The first ILD layer 260 may include silicon oxide, SiON, SiOC or SiOCN, SiCOH, and silicon nitride-based material includes silicon nitride, SiON, SiCN or SiOCN, or a dielectric material having a dielectric constant (k) lower than thermal silicon oxide (therefore referred to as low-k dielectric material layer), and/or other suitable dielectric material layer. The first ILD layer 260 may include a single layer or multiple layers. A CMP may be performed to polish back the first ILD layer 260 to expose a top surface of the dummy gate stacks 240. The silicon oxide-based material includes silicon oxide, SiON, SiOC or SiOCN, SiCOH, and silicon nitride-based material includes silicon nitride, SiON, SiCN or SiOCN.

Reference is made to FIG. 2B. The dummy gate stacks 240 (see FIG. 2A) are removed to form a plurality of openings 310 between the sidewall spacers 245. In some embodiments, the etching processes may include a selective wet etch and/or a selective dry etch, having an adequate etch selectivity with respect to the semiconductor fin 230 of the substrate 210, the sidewall spacer 245 and the first ILD layer 260. In some embodiments, a selective wet etching solution includes a tetramethylammonium hydroxide (TMAH), a $HF/HNO_3/CH_3COOH$ solution, or other suitable solution. The respective etch process may be tuned with various etching parameters, such as etchant used, etching temperature, etching solution concentration, etching pressure, source power, RF bias voltage, RF bias power, etchant flow rate, and/or other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. In another example a dry etching processes include a biased plasma etching process that uses a chlorine-based chemistry. Other dry etchant gasses include $CF_4$, $NF_3$, $SF_6$, and He. Dry etching may also be performed anisotropically using such mechanism as DRIE (deep reactive-ion etching). Alternatively, the dummy gate stacks 240 may be removed by a series of processes including photolithography patterning and etching back.

Figure 2C:
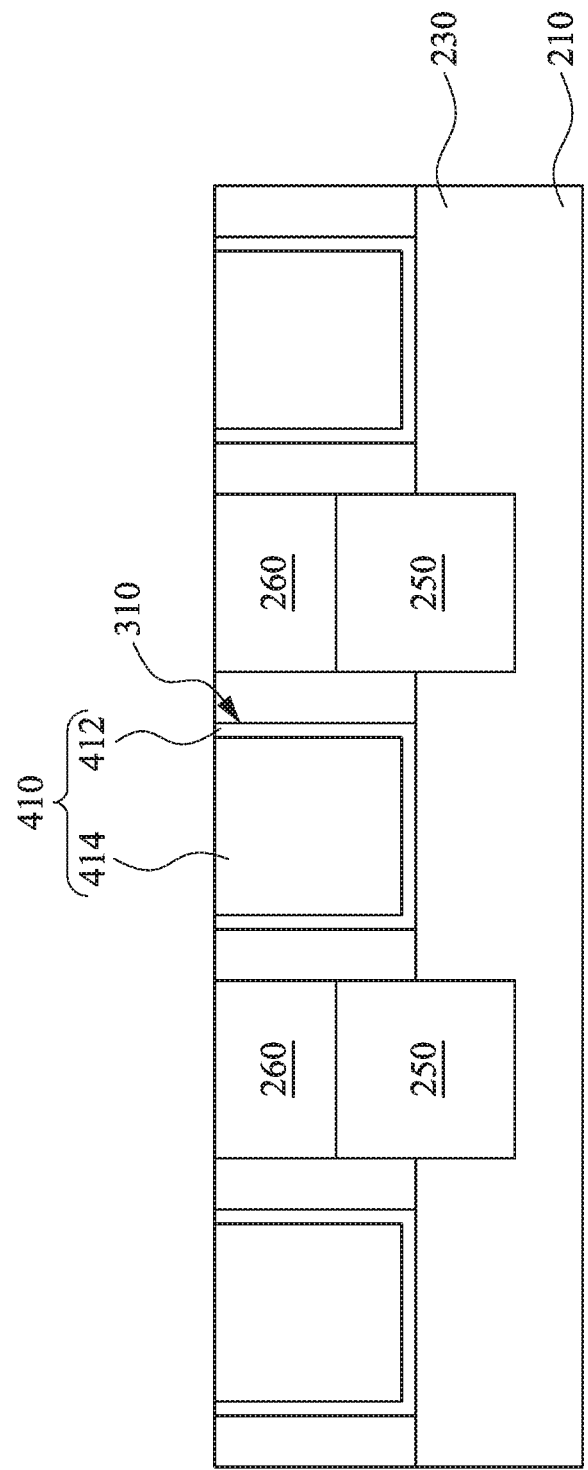

Reference is made to FIG. 2C. A plurality of gate stacks 410 are formed in the openings 310 (see FIG. 2B), including wrapping over upper portions of the semiconductor fin 230. A CMP process may be performed to remove excessive metal layer from a gate metal layer 414 hereby provide a substantially planar top surface of the gate metal layer 414. The gate stacks 410 may be a metal gate, a high K/metal gate, however other compositions are possible.

In some embodiments, high-K/metal gate (HK/MG) stacks 410 are formed within the openings 310, including wrapping around the portions of the semiconductor fins 230. In various embodiments, the HK/MG stack 410 includes an interfacial layer, a gate dielectric layer 412 formed over the interfacial layer, and a gate metal layer 414 formed over the gate dielectric layer 412. The gate dielectric layer 412, as used and described herein, include dielectric materials having a high dielectric constant, for example, greater than that of thermal silicon oxide (~3.9). The gate metal layer 414 may include a metal, metal alloy, and/or metal silicide. Additionally, the formation of the HK/MG stack 410 may include depositions to form various gate materials, one or more liner layers, and one or more CMP processes to remove excessive gate materials and thereby planarize a top surface of the semiconductor device 200.

The gate metal layer 414 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate metal layer 414 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the gate metal layer 414 may be formed by ALD, PVD, CVD, e-beam evaporation, or other suitable process. Further, the gate metal layer 414 may be formed separately for N-FET and P-FET transistors which may use different metal layers. In various embodiments, a CMP process may be performed to remove excessive metal from the gate metal layer 414 hereby provide a substantially planar top surface of the gate metal layer 414.

Figure 2D:
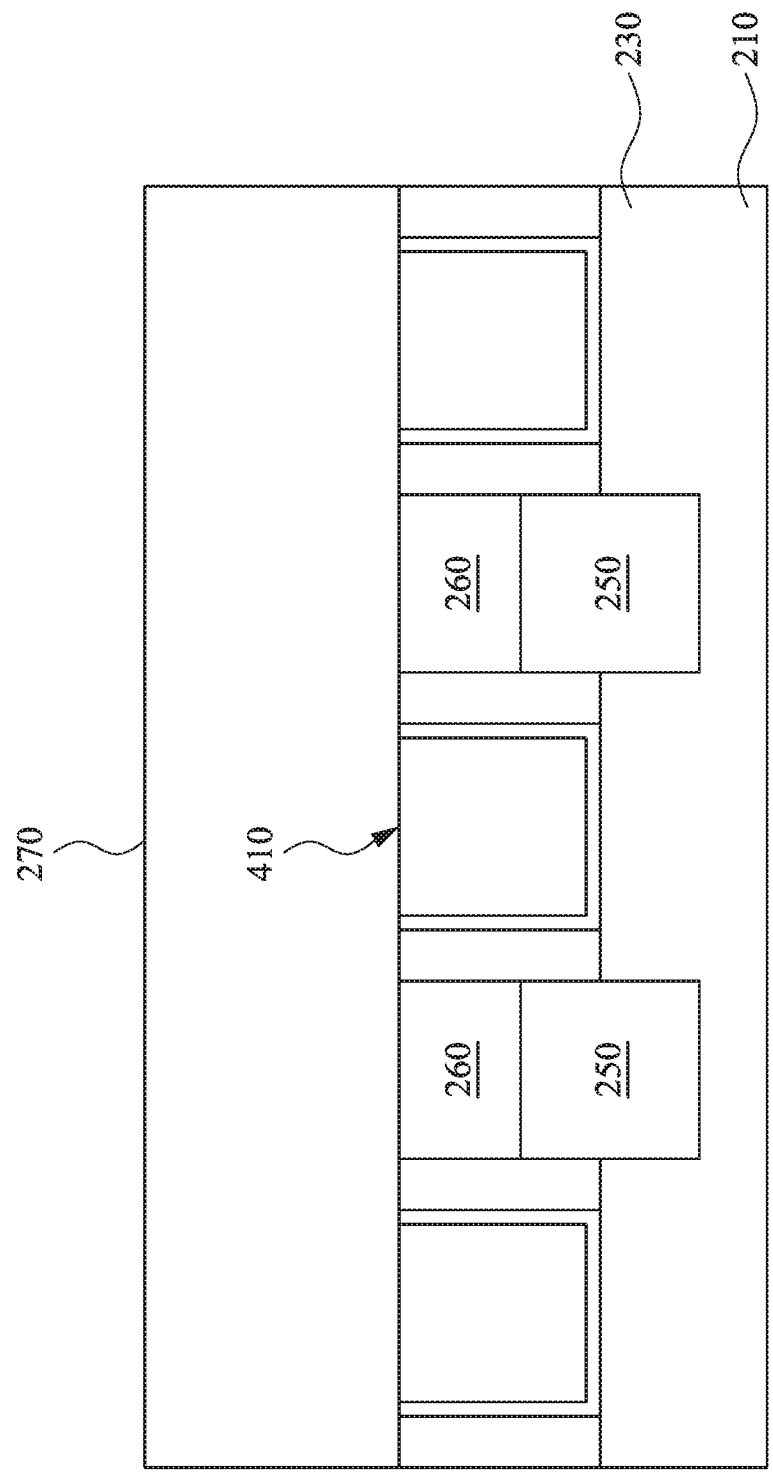

Reference is made to FIG. 2D. A second interlayer dielectric layer 270 is formed over the substrate 100 to cover the gate stacks 410, the first ILD layer 260, and the epitaxy structures 250. The second ILD layer 270 and the first ILD layer 260 may be made from the same material in some embodiments, and may be made from different materials in some other embodiments. The second ILD layer 270 may include silicon oxide, silicon nitride, oxynitride, a dielectric material having a dielectric constant (k) lower than thermal silicon oxide (therefore referred to as low-k dielectric material layer), and/or other suitable dielectric material layer.

Figure 2E:
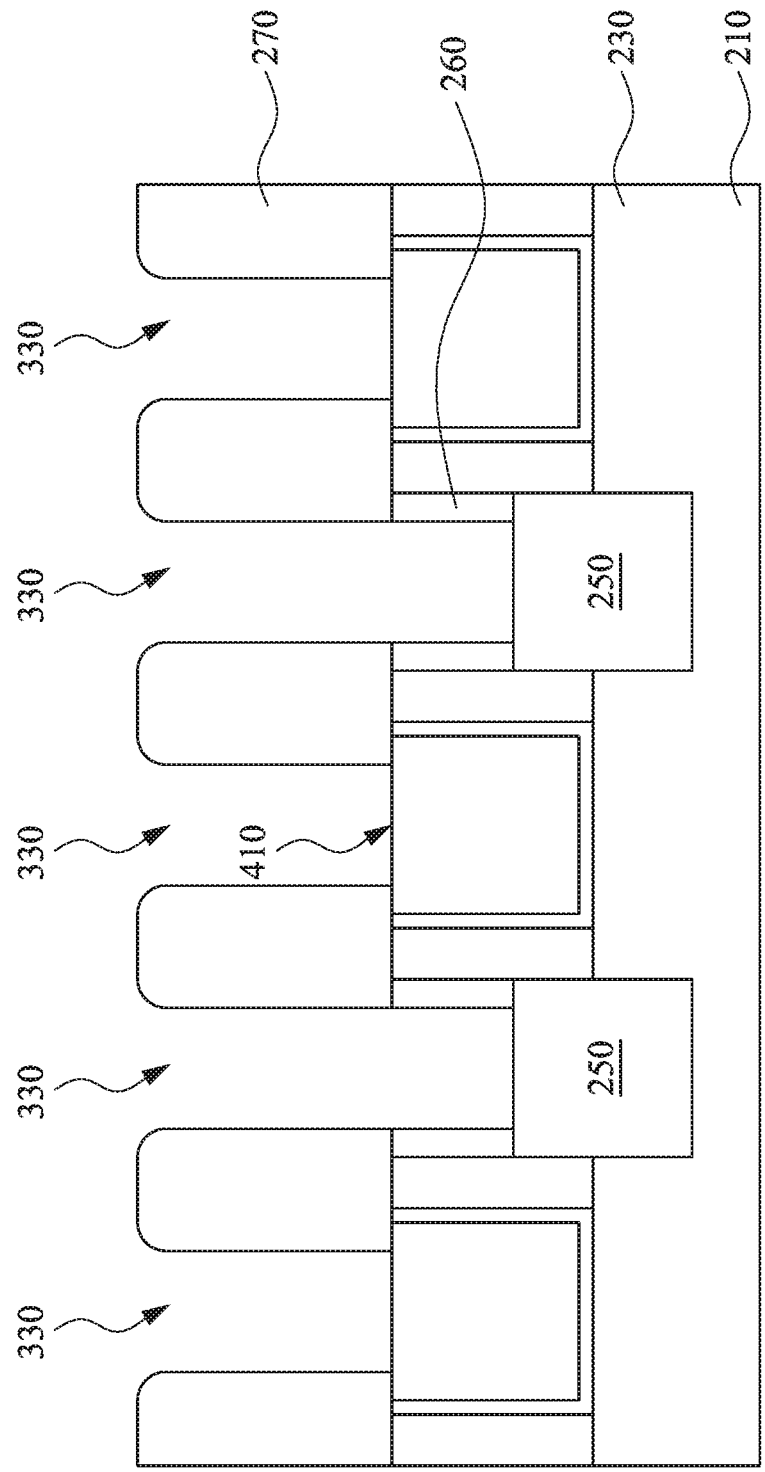

Reference is made to FIG. 2E. An etching process is performed to recess the first ILD layer 260 and the second ILD layer 270. Accordingly, a plurality of openings 330 are formed in the first ILD layer 260 and the second ILD layer 270. Some of the openings 330 expose the top surface of the gate stacks 410 through the second ILD layer 270. Some of the openings 330 expose the top surface of the epitaxy structures 250 through the first ILD layer 260 and the second ILD layer 270.

Figure 2F:
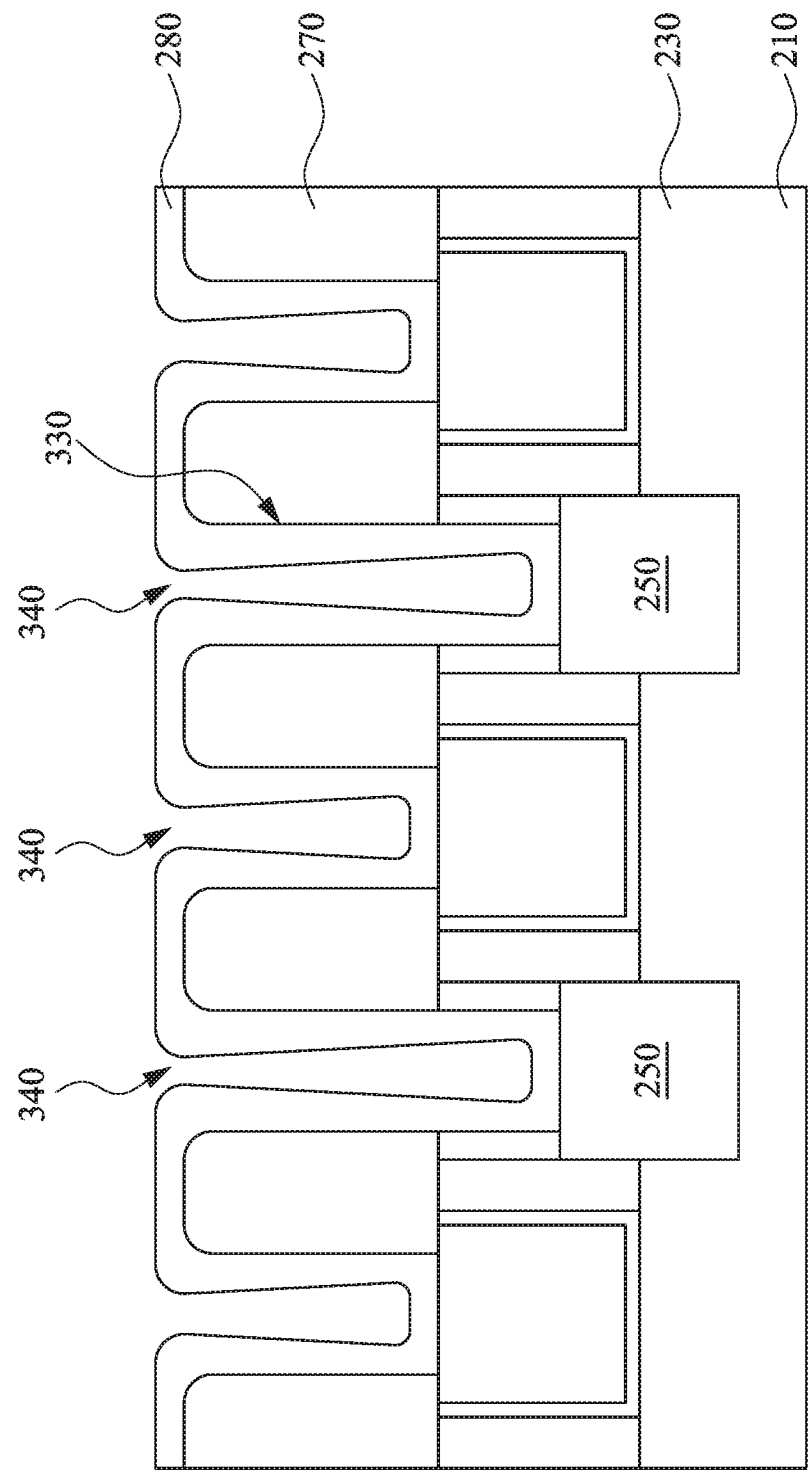

Reference is made to FIG. 2F. A glue layer 280 is formed over the second ILD layer 270 and in the openings 330. The glue layer 280 is conformally formed over the second ILD layer 270, such that the glue layer 280 is formed along the sidewalls of the second ILD layer 270 in the openings 330. As a result, the glue layer 280 has a plurality of openings 340 therein. In some embodiments, at least one of the openings 340 has tapered profile. That is, a width of one of the openings 340 increases from the top to the bottom.

In some embodiments, the glue layer 280 may include thin films of titanium (Ti), titanium nitride (TiN), or combinations thereof; or tantalum (Ta) and tantalum nitride (TaN), or combinations thereof. The glue layer 280 may be formed by PVD or CVD. For example, the glue layer 280 may be formed by forming a Ti layer over the substrate 210 and in the openings 330, and then forming a TiN layer over the Ti layer. Accordingly, the glue layer 280 serves to coat the surfaces of the openings 230 as well as the upper surface of the second ILD layer 270 and is used to provide adhesion between the conductive layer formed in later processes.

In some embodiments, an annealing process is performed to the glue layer 280 and the substrate 210. The annealing process may include furnace annealing process, rapid thermal annealing (RTA) process, spike annealing process, laser annealing process, coherent light irradiation annealing process, or other suitable processes.

Figure 2G:
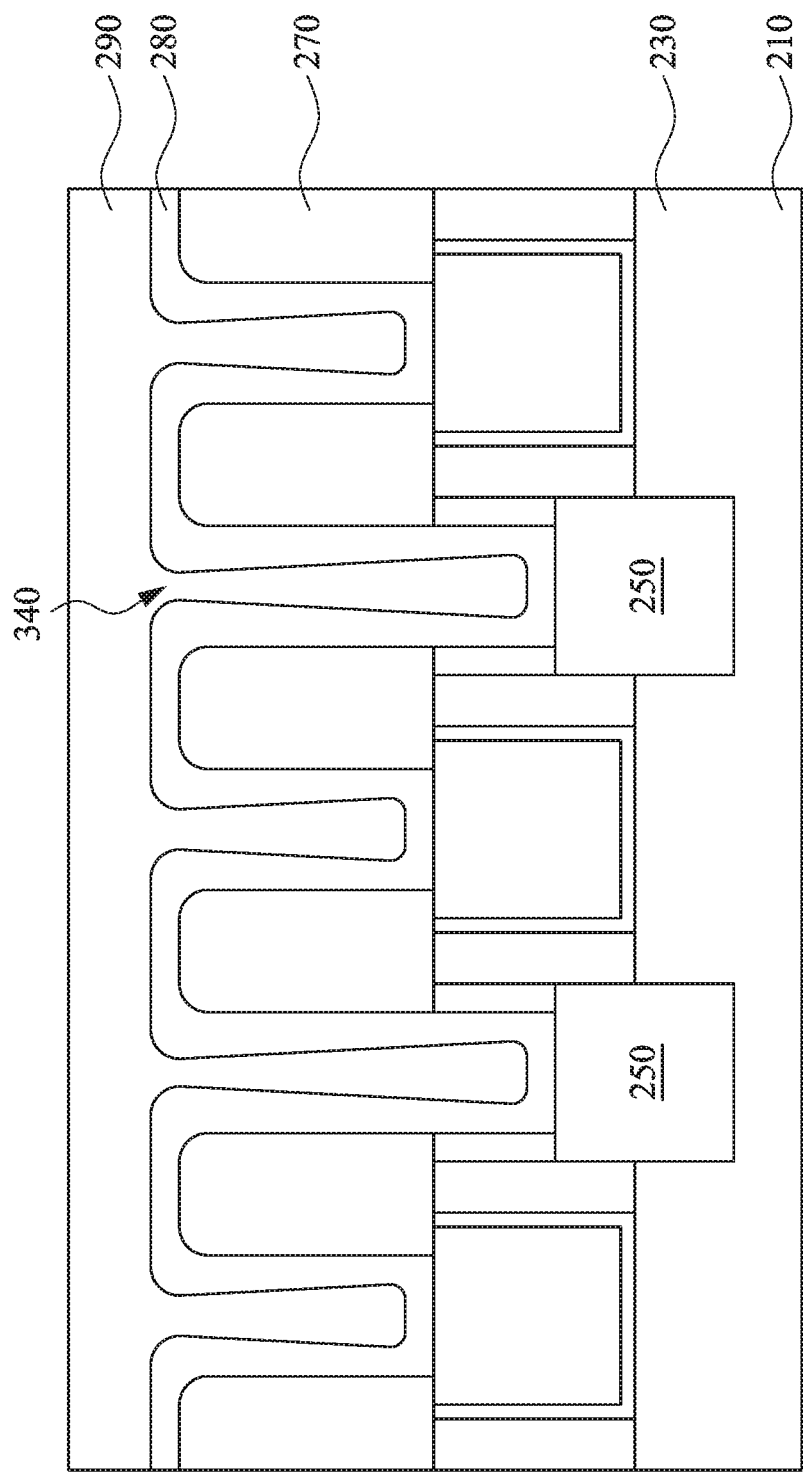

Reference is made to FIG. 2G. A dielectric layer 290 is formed over the second ILD layer 270, as well as the substrate 210, and in the openings 340 to cover the glue layer 280. The dielectric layer 290 may be a bottom antireflective coating (BARC) layer, and may be referred to as BARC layer 290.

The BARC layer 290 reduces reflection of light during a lithography process. The BARC layer 290 may include transparent thin film structures with alternating layers of dielectric materials of contrasting refractive index. In some embodiments, the BARC layer 290 may include high K material such as a hafnium oxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, titanium nitride (TiN). In some other embodiments, the layers of silicon nitride and silicon oxide (SiN/SiO) may be used. In yet some other embodiments, a layer of silicon carbide (SiC) may be used. The BARC layer 290 may be formed by CVD, PVD, thermal oxidization or other suitable techniques.

Figure 2H:
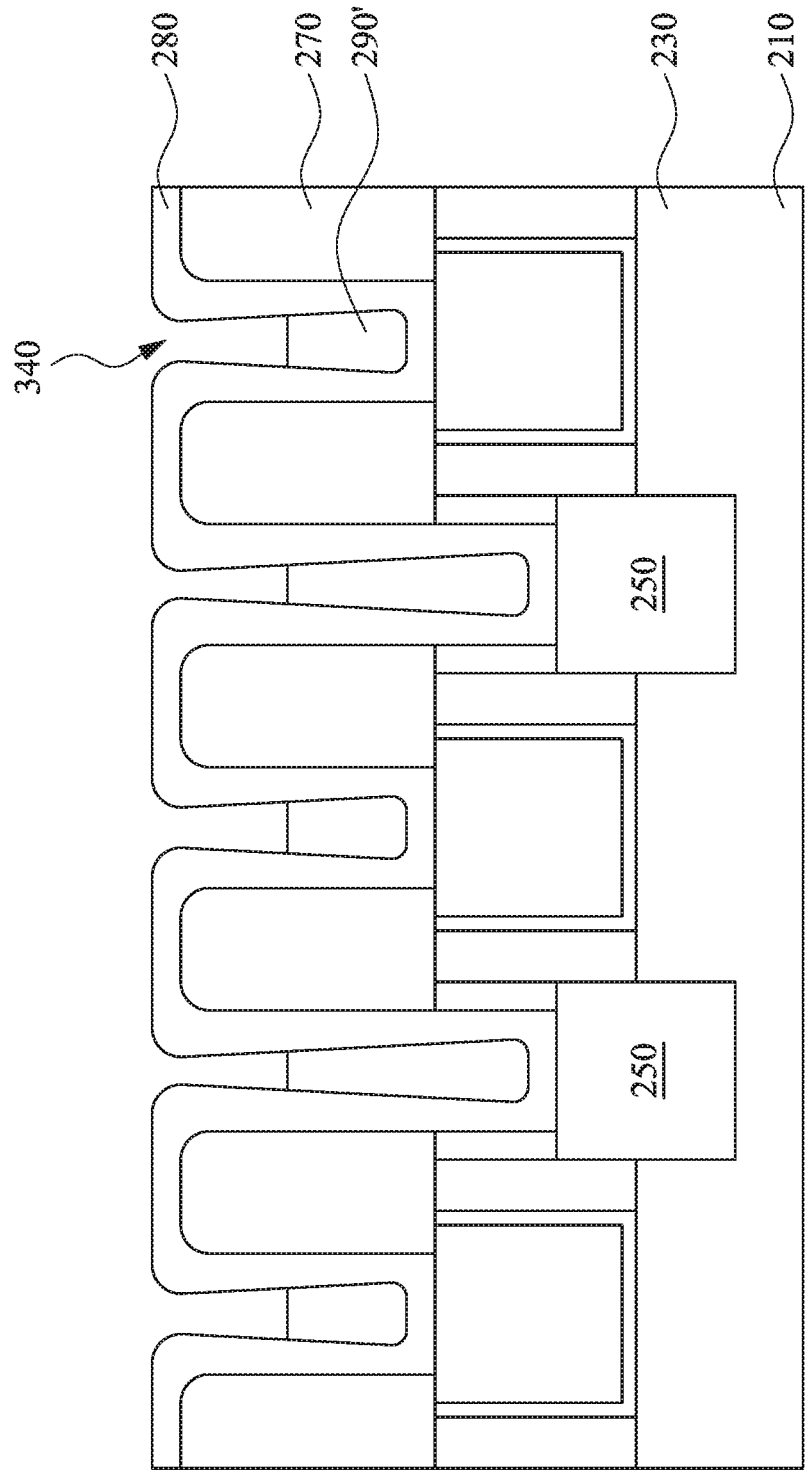

Reference is made to FIG. 2H. An etching process is performed to partially remove the dielectric layer 290 in FIG. 2G. Accordingly, portions of the dielectric layer 290 remain in the openings 340 and on the glue layer 280. The remained portions of the dielectric layer 290 may be referred to as dielectric structures 290' (or BARC structures 290'). State differently, various dielectric structures 290' are formed in the openings 340 and on the glue layer 280 after the etching process. In FIG. 2H, a top surface of the dielectric structure 290' is lower than a top surface of the glue layer 280.

Figure 2I:
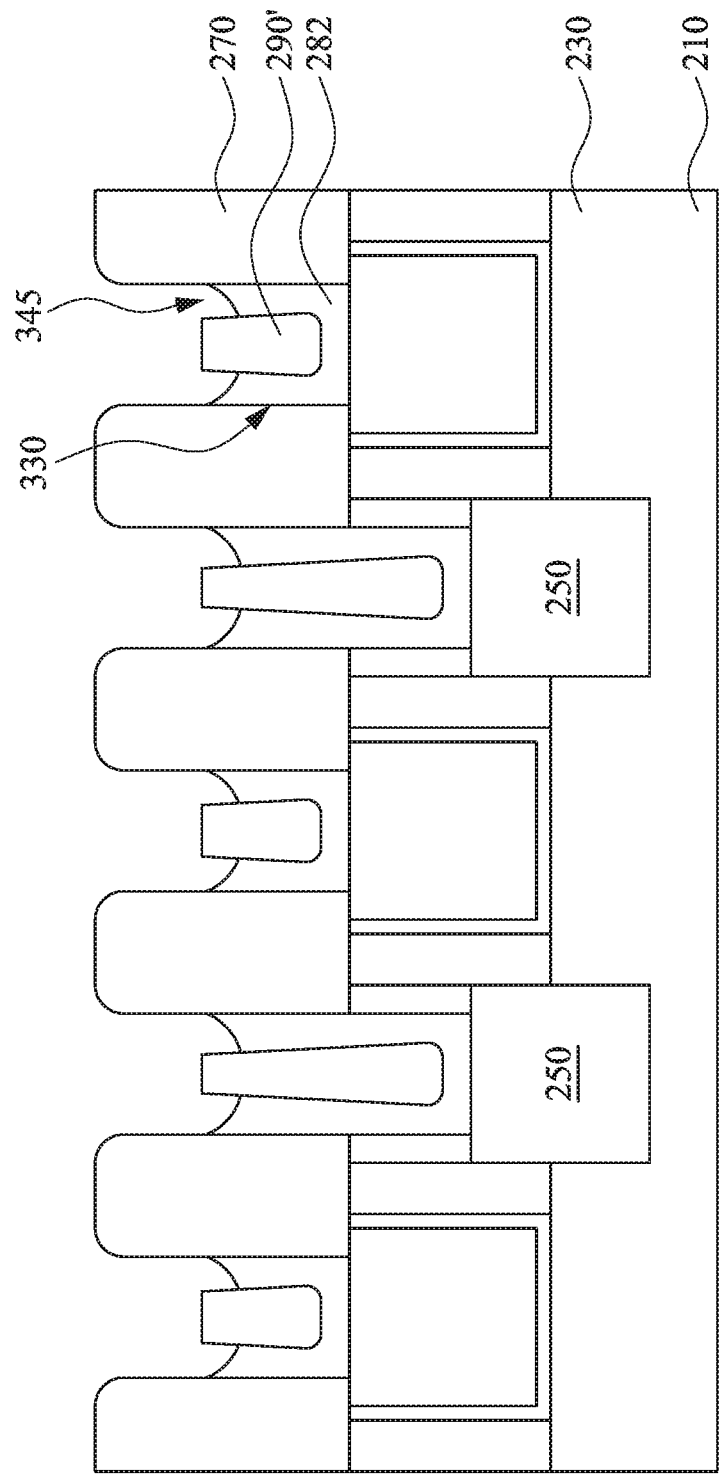

Reference is made to FIG. 2I. An (selectively) etching process is performed to partially remove the glue layer 280 in FIG. 2G. That is, the dielectric structure 290' is used as a mask to partially remove the glue layer 280. Accordingly, portions of the glue layer 280 are remained in the openings 330, respectively. The remained portions of the glue layer 280 are labeled as 282, and may be referred to as remained glue layer 282 in the following description. In some embodiments, the glue layer 280 is etched below the dielectric structures 290', such that a plurality of recesses 345 are formed between the remained portions of the glue layer 280 and the dielectric structures 290'. That is, a top surface of the remained portions of the glue layer 280 is lower than the top surface of the dielectric structure 290'. From other perspectives, the etching process is tuned such that the dielectric structures 290' are protruded from the remained glue layer 282.

Figure 2J:
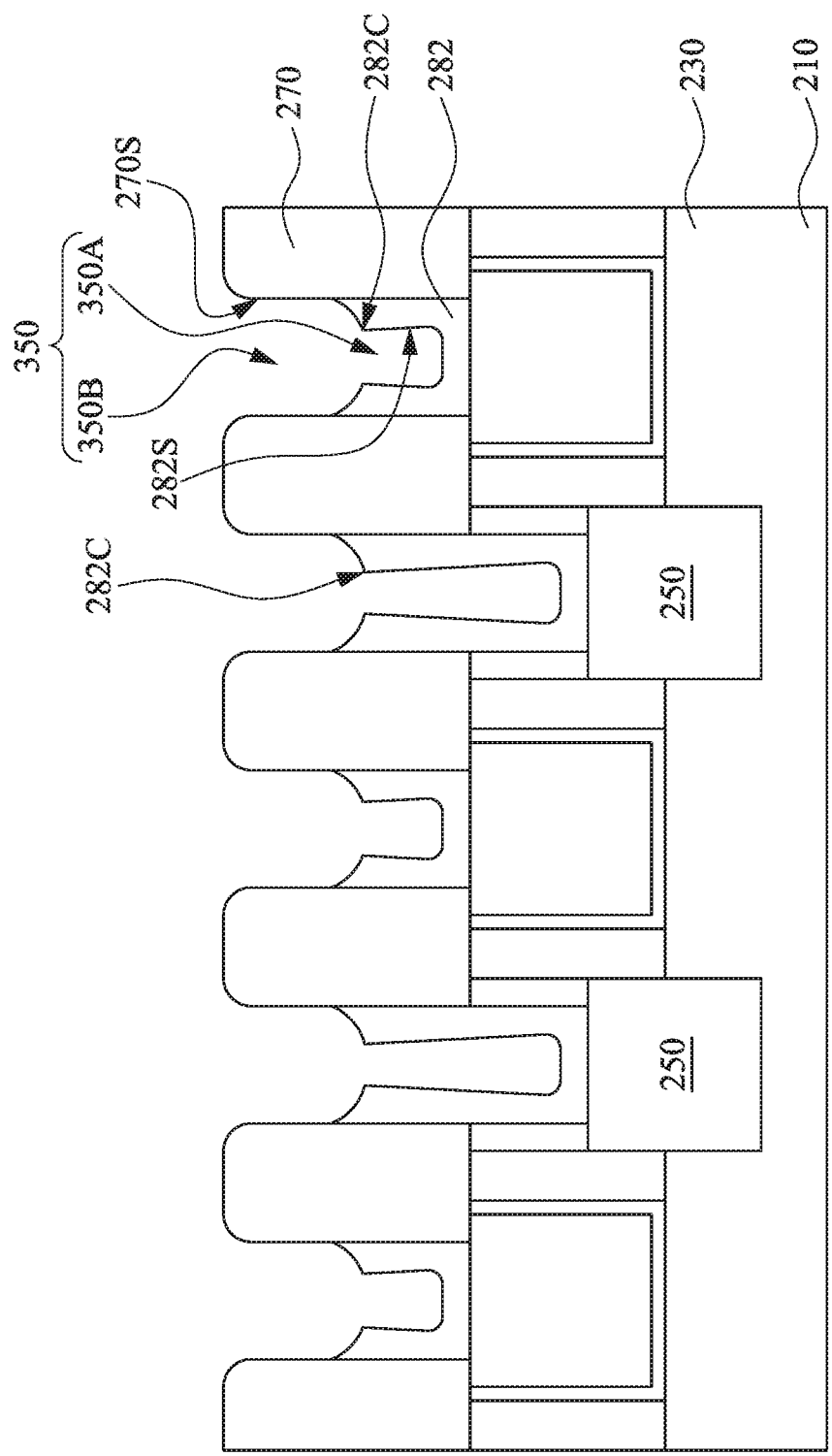

Reference is made to FIG. 2J. The dielectric structures 290' (or the remained portions of the dielectric layer) on the glue layer 282 in FIG. 2I are removed by suitable process, such as etching. After the dielectric structures 290' are removed, the surface of the remained glue layer 282 exposes. Since the dielectric structures 290' are removed, a plurality of corner portions 282C on the top of the glue layer 282 are exposed. In some embodiments, at least one of the corner portions 282C protruded from the surface of the glue layer 282. That is to say, the glue layer 282 has a discontinuous surface on at least one side of the glue layer 282.

After the dielectric structures 290' are removed, a plurality of openings 350 are formed between the second ILD layer 270. At least one of the openings 350 includes a bottom portion 350A and a top portion 350B connected to each other, in which the bottom portion 350A of the openings 350 is between the remained glue layer 282, and the top portion 350B of the openings 350 expose at least one sidewall 270S of the second ILD layer 270. In other words, the bottom portion 350A of the openings 350 is defined by the remained glue layer 282, and the top portion 350B of the openings 350 is defined by the exposed sidewall 270S of the second ILD layer 270. A width of the top portion 350B is greater than a width of the bottom portion 350A.

Reference is made to FIG. 2K. An etching process is performed to the remained glue layer 282 to tune the profiles of the remained glue layer 282. Accordingly, the glue layer 282 is shrunk, and the shrunk glue layer 282 is labeled 284 and may be referred to as shrunk glue layer 284 in the following descriptions. Since the glue layer 282 in FIG. 2J is shrunk, the thickness of the shrunk glue layer 284 is smaller than the glue layer 282 in FIG. 2J. In some embodiments, the etching process may be an isotropic etching, such as wet etching. The wet etching solution may include HF, $NH_4OH$, $NH_4F$, $H_2O$, $H_2O_2$, $HNO_3$, $CH_3COOH$, carboxylic acid or surfactant.

After the etching process, a plurality of openings 350' having a bottom portion 350A' and a top portion 350B' are formed. Since the glue layer 284 is shrunk, the bottom portion 350A' of the openings 350' is larger than the bottom portion 350A of the opening 350 in FIG. 2J. In other words, the etching process is also performed to tune the profiles of the bottom portions 350A of the openings 350 in FIG. 2J. For example, the etching process enlarges the opening 350 in FIG. 2J.

After the etching process, the corner portions 282C of the remained glue layer 282 in FIG. 2J are removed to have smooth surfaces on the shrunk glue layer 284. In other words, the etching process smoothes the inner surface 282S of the glue layer 282 in FIG. 2J. As a result, the shrunk glue layer 284 is smoother and thinner than the glue layer 282 in FIG. 2J.

Figure 2L:
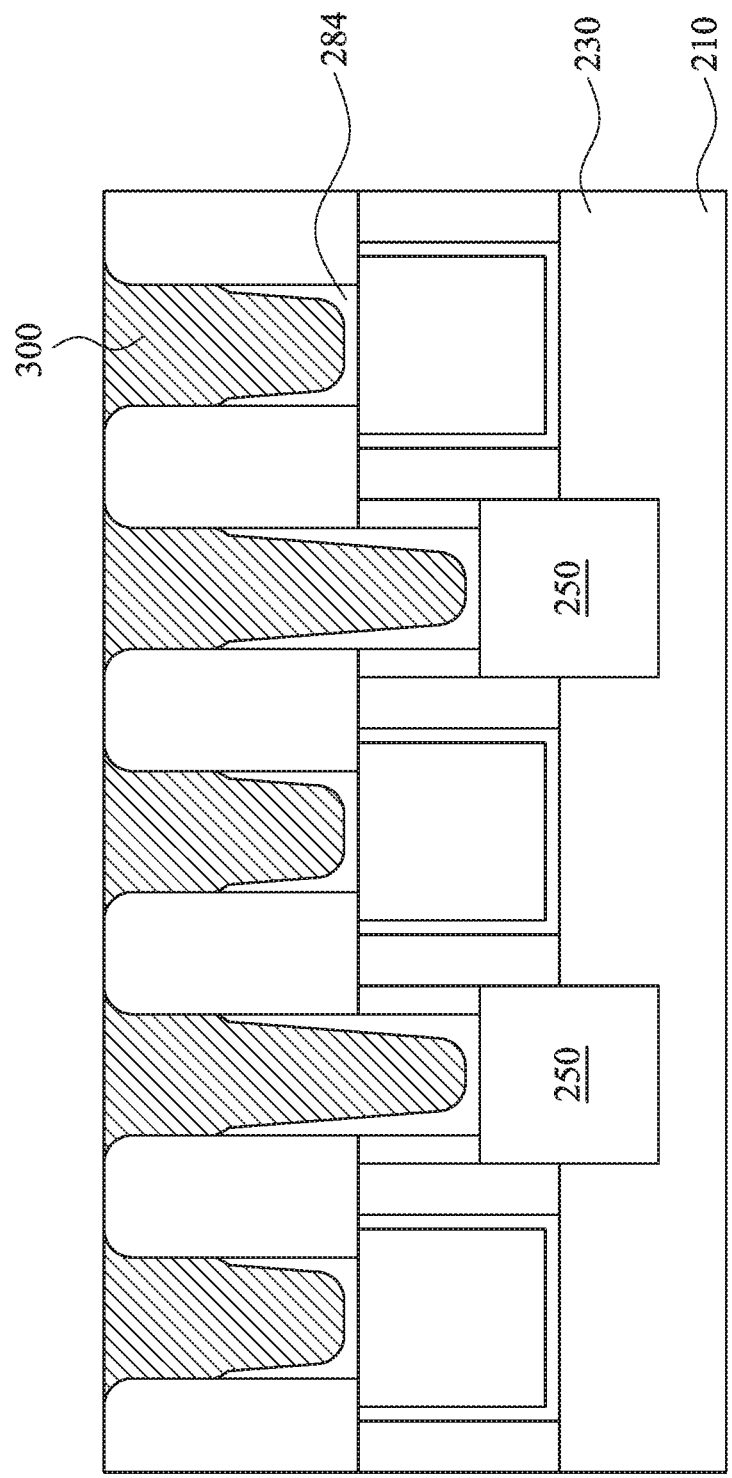

Reference is made to FIG. 2L. A plurality of conductive layers 300 are formed respectively in the openings 350' (see FIG. 2K) and on the glue layer 284. That is, the conductive layers 300 cover the remained glue layer 284. In some embodiments, the conductive layers 300 may be a metal layer, and the material of the conductive layers 300 may include cobalt (Co), tungsten (W), low K metals, or suitable metals. The conductive layers 300 may be formed by, for example, depositing a conductive material over the substrate 210. Then, a CMP process is performed to remove excessive conductive material to form the conductive layers 300.

In some other embodiments, the metal material for the conductive layers 300 is one or more layers of Al, Cu, Co, Mn, W, Ni, Ti, Ta, Ru, Rh, Ir, Mo, or an alloy thereof, TiN, TaN, TiW, WN, TiAl, TiAlN, TaC, TaCN, NiSi and TiSiN. The conductive material can be filled in the recess by using a selective electro-less plating method or a selective CVD method. The conductive layers 300 may include a barrier layer (not shown) and a body conductive layer.

According to the aforementioned embodiments, a plurality of openings are formed in an interlayer dielectric layer over a substrate for exposing a plurality of gate stacks and epitaxy structures. A glue layer is formed in the substrate to cover the gate stacks and the epitaxy structures. An etching process is performed to partially remove the glue layer, such that the remained glue layer has discontinuous surface. Another etching process is performed to smooth the discontinuous surface of the remained glue layer, such that the conductive layer formed later may be easily filled into the openings in the glue layer. With this configuration, the performance of the semiconductor device can be improved.

An embodiment of the present disclosure provides a method for manufacturing a semiconductor device including forming a gate stack over a substrate; forming an interlayer dielectric over the substrate to cover the gate stack; forming an opening in the interlayer dielectric to expose to the gate stack; forming a glue layer over the interlayer dielectric and in the opening; partially removing the glue layer, in which a portion of the glue layer remain in the opening; and tuning a profile of the remained portion of the glue layer.

Another embodiment of the present disclosure provides a method for manufacturing a semiconductor device including forming a metal gate over a substrate; forming an epitaxy structure over the substrate; forming an interlayer dielectric over the substrate to cover the metal gate and the epitaxy structure; recessing the interlayer dielectric to form at least two openings in the interlayer dielectric respectively exposing the metal gate and the epitaxy structure; forming a glue layer over the interlayer dielectric and in the openings; performing a first etching process to the glue layer, in which portions of the glue layer respectively remain in the openings; and removing a plurality of corner portions of the remained portions of the glue layer.

In yet another embodiment of the present disclosure provides a method for manufacturing a semiconductor device including forming a gate stack over a substrate; forming an interlayer dielectric over the substrate to cover the gate stack; forming a first opening in the interlayer dielectric to expose the gate stack; forming a glue layer in the first opening, in which the glue layer has a second opening; partially removing the glue layer to form a third opening having a bottom portion and a top portion, in which the bottom portion is between the remained glue layer, and the top portion exposes at least one sidewall of the interlayer dielectric; and tuning a profile of the bottom portion of the third opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising: forming an epitaxy structure over a substrate; forming an interlayer dielectric over the substrate to cover the epitaxy structure; forming an opening in the interlayer dielectric to expose to the epitaxy structure; forming a glue layer over the interlayer dielectric and in the opening; partially removing the glue layer such that a top surface of a remained portion of the glue layer is lower than a top surface of the interlayer dielectric; and tuning a profile of the remained portion of the glue layer after partially removing the glue layer, wherein the tuning comprises reducing a thickness of the glue layer.

2. The method of claim 1, wherein the tuning comprises performing an etching process to the remained portion of the glue layer.

3. The method of claim 1, wherein the glue layer is made from Ti, TiN, or combinations thereof.

4. The method of claim 1, further comprising performing an annealing process to the glue layer and the substrate.

5. The method of claim 1, further comprising:
forming a dielectric layer in the opening to cover the glue layer;
partially removing the dielectric layer, wherein a portion of the dielectric layer remain in the opening and on the glue layer; and
removing the remained portion of the dielectric layer to expose the remained portion of the glue layer.

6. The method of claim 5, wherein the dielectric layer is a bottom-anti-reflective coating (BARC) layer.

7. The method of claim 1, further comprising forming a conductive layer in the opening and on the remained portion of the glue layer after the tuning operation.

8. A method for manufacturing a semiconductor device, comprising:
forming a metal gate over a substrate;
forming an epitaxy structure over the substrate;
forming an interlayer dielectric over the substrate to cover the metal gate and the epitaxy structure;
recessing the interlayer dielectric to form at least two openings in the interlayer dielectric respectively exposing the metal gate and the epitaxy structure;
forming a glue layer over the interlayer dielectric and in the at least two openings;
performing a first etching process to the glue layer, wherein portions of the glue layer respectively remain in the at least two openings after performing the first etching process; and
removing a plurality of corner portions of the remained portions of the glue layer.

9. The method of claim 8, further comprising:
forming a plurality of bottom-anti-reflective coating (BARC) structures in the at least two openings and on the glue layer; and
removing the BARC structures on the remained portions of the glue layer, wherein the corner portions of the remained portions of the glue layer are exposed.

10. The method of claim 9, wherein the first etching process comprises recessing the glue layer until the BARC structures are protruded from the remained portions of the glue layer.

11. The method of claim 9, wherein the forming the BARC structures comprises:
forming a BARC layer over the interlayer dielectric and in the at least two openings; and
performing a second etching process to the BARC layer to form the BARC structures.

12. The method of claim 8, further comprising forming a metal layer in the at least two openings to cover the remained portions of the glue layer after the removing the corner portions of the remained portions of the glue layer.

13. The method of claim 12, wherein the metal layer is cobalt (Co) or tungsten (W).

14. A method for manufacturing a semiconductor device, comprising:
forming a gate stack over a substrate;
forming an interlayer dielectric over the substrate to cover the gate stack;
forming an opening in the interlayer dielectric to expose the gate stack;
forming a glue layer over the interlayer dielectric and in the opening;
removing a first portion the glue layer from a top surface of the interlayer dielectric, wherein a second portion of the glue layer remains in the opening after removing the first portion of the glue layer; and
tuning a profile of the second portion of the glue layer, wherein the tuning comprises performing an etching process to the second portion of the glue layer.

15. The method of claim 14, wherein the etching process is an isotropic etching process.

16. The method of claim 14, further comprising forming a dielectric structure in the second portion of the glue layer.

17. The method of claim 14, further comprising forming a cobalt layer or a tungsten layer over the second portion of the glue layer after tuning the profile of the second portion of the glue layer.

18. The method of claim 1, wherein tuning the profile of the remained portion of the glue layer is performed such that the remained portion of the glue layer has a tapered top end.

19. The method of claim 14, wherein tuning the profile of the second portion of the glue layer is performed such that the second portion of the glue layer has a thickness decreasing as a distance from the gate stack increases.

20. The method of claim 2, wherein the etching process is an isotropic etching process.

* * * * *